United States Patent [19]
Masumoto

[11] Patent Number: 5,438,279
[45] Date of Patent: Aug. 1, 1995

[54] OPTION SETTING CIRCUIT FOR INTERFACE CIRCUIT

[75] Inventor: Hiroaki Masumoto, Kyoto, Japan

[73] Assignee: Rohm Co., Ltd., Kyoto, Japan

[21] Appl. No.: 163,538

[22] Filed: Dec. 9, 1993

[30] Foreign Application Priority Data

Dec. 10, 1992 [JP] Japan .................. 4-330366

[51] Int. Cl.⁶ .............. H03K 19/173; H03K 19/0175
[52] U.S. Cl. .................................. 326/38; 326/86; 327/143; 327/530
[58] Field of Search .............. 307/465, 475, 272.3, 307/480, 449, 443; 326/83, 86, 46, 49, 105, 108, 93, 38; 327/142-144

[56] References Cited
U.S. PATENT DOCUMENTS 4,697,107  9/1987  Haines ........................ 307/475
4,783,606 11/1988  Goetting ...................... 307/465
4,806,793  2/1989  Golab ........................ 307/443
5,059,828 10/1991  Tamagawa .................... 307/449

Primary Examiner—David R. Hudspeth
Assistant Examiner—Jon Santamauro
Attorney, Agent, or Firm—Nikaido, Marmelstein, Murray & Oram

[57] ABSTRACT

In a microcomputer, a circuit is provided which performs the option setting of the condition of an I/O port. The option setting is repeatedly performed while the microcomputer is operating. As a result, even if the option setting is changed to an incorrect setting due to noise from external sources, the incorrect option setting is immediately returned to the correct setting. Moreover, the option setting is never reset at the time of resetting other than the resetting performed at the time of the turning on of the power.

5 Claims, 5 Drawing Sheets

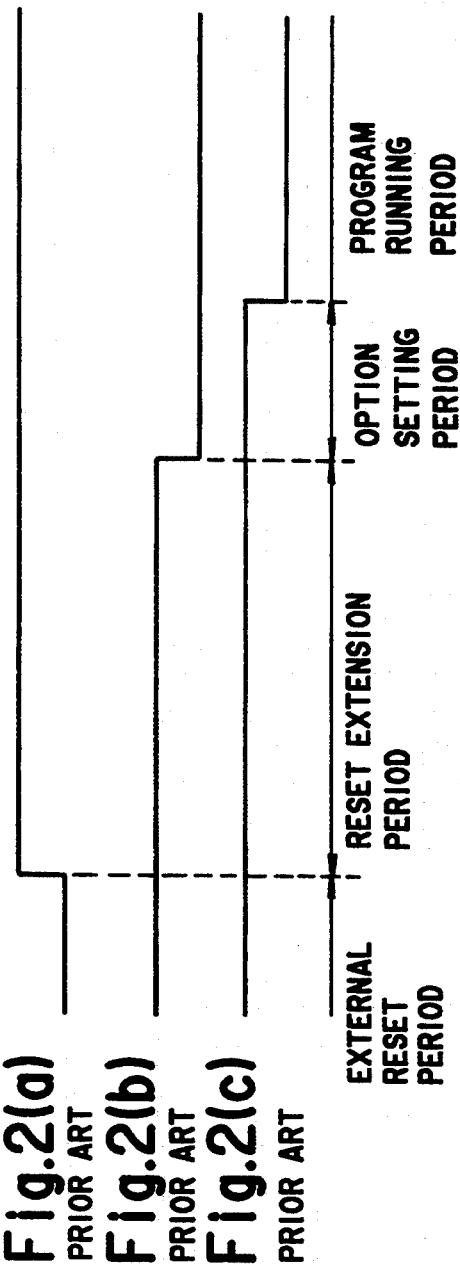
Fig.2(a) PRIOR ART
Fig.2(b) PRIOR ART
Fig.2(c) PRIOR ART
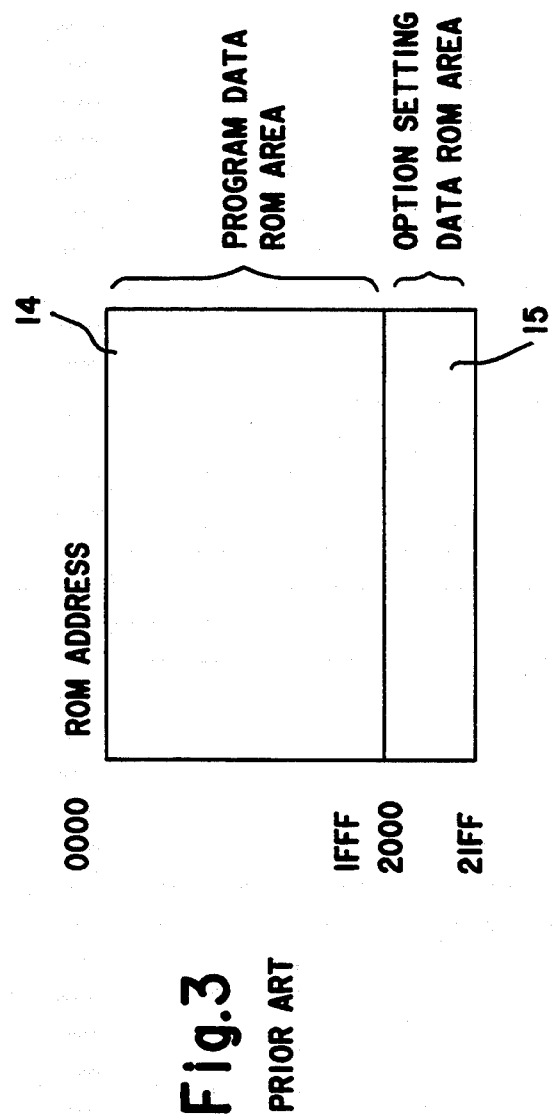
Fig.3 PRIOR ART

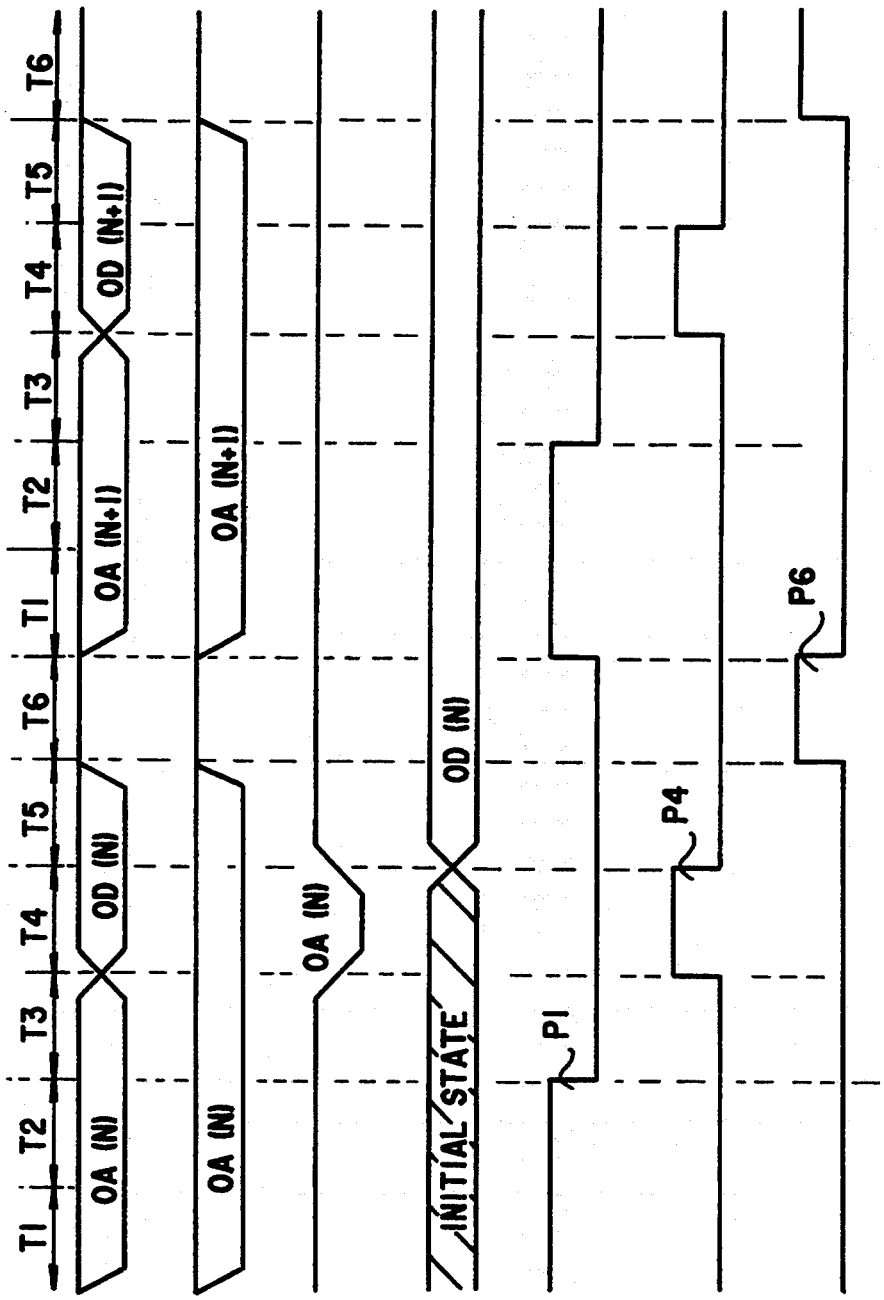

OPTION SETTING CIRCUIT FOR INTERFACE CIRCUIT

BACKGROUND OF THE INVENTION

1. Field of the Invention

The present invention relates to an option setting circuit for use in a one-chip microcomputer employed in an electronic apparatus, such as a camera, a compact disk player and a video cassette recorder, provided with a one-chip microcomputer.

2. Description of the Prior Art

Conventionally, an interface circuit, such as a one-chip microcomputer, is provided with an option setting circuit since options may be changed after the manufacture in accordance with the structures of peripheral integrated circuits (ICs) and discrete parts. Such an option setting circuit is also used to change options on the spot when specifications are changed while a system is being designed in an IC chip for evaluating an application program for a one-chip microcomputer.

FIG. 1 shows a conventional option setting circuit. An input/output (I/O) circuit 1 is provided with an inverter 2 and a p-channel metal oxide semiconductor (MOS) transistor 4 for pulling up an input terminal of the inverter 2 to a power supply line 3. When an input terminal of the inverter 2 is connected through an input pad 5 to, for example, an external switching circuit, if the switching circuit is a complementary metal oxide semiconductor (CMOS) transistor, since both "0" and "1" signals are produced in the switching circuit and are input to the input pad 5, it is unnecessary to pull up the input terminal of the inverter 2 to the power supply line 3. Hence, the transistor 4 is set to be disabled.

However, when the external switching circuit is constituted by, for example, an n-channel MOS transistor which is connected between the pad 5 and a ground line, since only a "0" signal is input to the input pad 5, it is necessary to produce a "1" signal in the I/O circuit 1. Hence, in that case, it is necessary to design the option setting circuit so that the transistor 4 is always ON. Under a condition where the transistor 4 is ON, the input of the inverter 2 is "1" (a voltage VDD at the power supply line 3) when the external switching circuit is OFF, while the input of the inverter 2 is "0" when the external switching circuit is ON since a "0" signal is input. In FIG. 1, 6 is a resistor, and 7 is a protecting circuit including diodes D1 and D2.

The setting of whether to activate or disable the transistor 4 (option setting) is performed as follows. An option data read only memory (ROM) 11 (e.g. an electrically erasable programmable read only memory [EEPROM]) and an option latch circuit 8 are simultaneously opened when the data on an address data bus line 9 is changed to an option address data specifying the present option latch circuit 8, and an option data is read out from an address of the option data ROM 11 which is specified by the option address data. A specified option latch circuit 8 takes in the option data through a data bus line 10.

In this case, the data output from the option data ROM 11 is "1" or "0". For example, when a "0" signal is output and is latched by the option latch circuit 8, the output of the option latch circuit 8 is "0", i.e. low, so that the transistor is activated.

Then, when the data on the address data bus line 9 is changed to another address data not specifying the present option latch circuit 8, the option data ROM 11 and the option latch circuit 8 are both closed, so that data transfer is stopped. Thus, the option setting is completed.

The data on the address data bus line 9 is changed to the option address data specifying the present option latch circuit 8 during an option setting period at the time of resetting. If an external reset signal is applied, for example, by a depression of a reset button in the case of the personal computer, during the operation period of the one-chip microcomputer (i.e. during the program running period) after the turning on of the power, first and second internal reset signals (being active under high state as shown at (b) and (c) in FIG. 2) which extend the reset period are produced in response to the external reset signal (being active under low state as shown at (a) in FIG. 2). A non-illustrated central processing unit (CPU) of the one-chip microcomputer outputs the option address data to the address data bus line 9 during the option setting period ranging from the fall of the first internal reset signal to the fall of the second internal reset signal, so that the option is set.

The first internal reset signal is for resetting the option latch circuit 8 to its initial state. The second internal reset signal is for resetting counters and registers not associated with the option setting to their initial states. The first internal reset signal is input through inverters 12 and 13 to a set terminal S of the option latch circuit 8. In this case, an output terminal Q thereof is set to be high.

The ROM address of the option data ROM 11 is as shown in FIG. 3. That is, an option setting data ROM area 15 is allotted to an area extending from a program data ROM area 14. If the option setting data ROM area 15 begins at address 2000 and the option data at the address is for option setting for the I/O circuit 1, option setting for another I/O circuit (not shown) is performed based on, for example, an option data at the next address 2001 on the address data bus line 9. Option setting for a plurality of portions associated with the microcomputer is subsequently performed in a similar manner.

In the conventional option setting circuit of the above-described arrangement, however, since, during the program running period, the option setting is performed only at the time of resetting, if the option data latched by the option latch circuit is changed due to noise from external sources and electrostatic surge, the incorrect option is maintained until the next resetting. This results in a malfunction of the system.

Moreover, at the time of resetting during the program running period, since the latched option data is once reset to its initial state before being latched again, that is, since the option setting is changed, a malfunction may occur.

SUMMARY OF THE INVENTION

An object of the present invention is to provide an option setting circuit where option setting is repeatedly performed during an operation period after the turning on of the power and option setting is not changed at the time of resetting during the operation period.

To achieve the above-mentioned object, an option setting circuit of the present invention is provided with an option data memory which takes out an option data from an address and outputs the option data, the address being specified by an option address data, a latch circuit which latches the option data output from the option data memory based on the option address data, the latch circuit being reset when power is turned on, a circuit being set to a predetermined circuit state in accordance with an output of the latch circuit, and an option address circuit which causes the option address data to be generated in a predetermined cycle during an operation period after the turning on of the power.

According to such a feature, since the option setting is repeatedly performed during the operation period, even if the option setting is changed to an incorrect one due to noise from external sources, the incorrect option setting is immediately returned to the correct one. Moreover, the option setting is never reset at the time of resetting other than the resetting performed at the time of the turning on of the power.

BRIEF DESCRIPTION OF THE DRAWINGS

This and other objects and features of this invention will become clear from the following description, taken in conjunction with the preferred embodiments with reference to the accompanied drawings in which:

FIG. 2 is a timing chart of a reset signal of the option setting circuit of FIG. 1;

FIG. 3 is an explanatory view of option data of the option setting circuit of FIG. 1;

FIG. 6 is a timing chart of the embodiment of FIG. 4.

DESCRIPTION OF THE PREFERRED EMBODIMENTS

Figure 1:
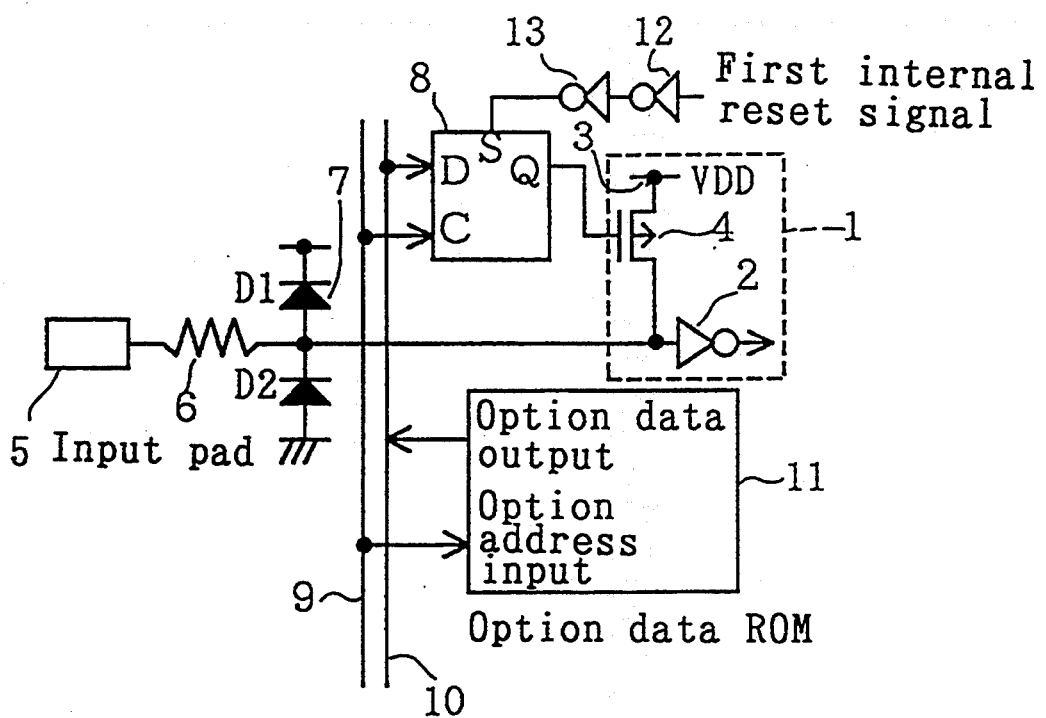
FIG. 1 shows a conventional option setting circuit.

An embodiment of the present invention will hereinafter be described with reference to the drawings. The same elements as those of the above-described prior art of FIG. 1 are denoted by the same reference designations, and a description thereof will not be given.

In this embodiment, option setting is repeatedly performed by performing the addressing of the option latch circuit and the option data ROM in a predetermined cycle even during the program running period.

Figure 4:
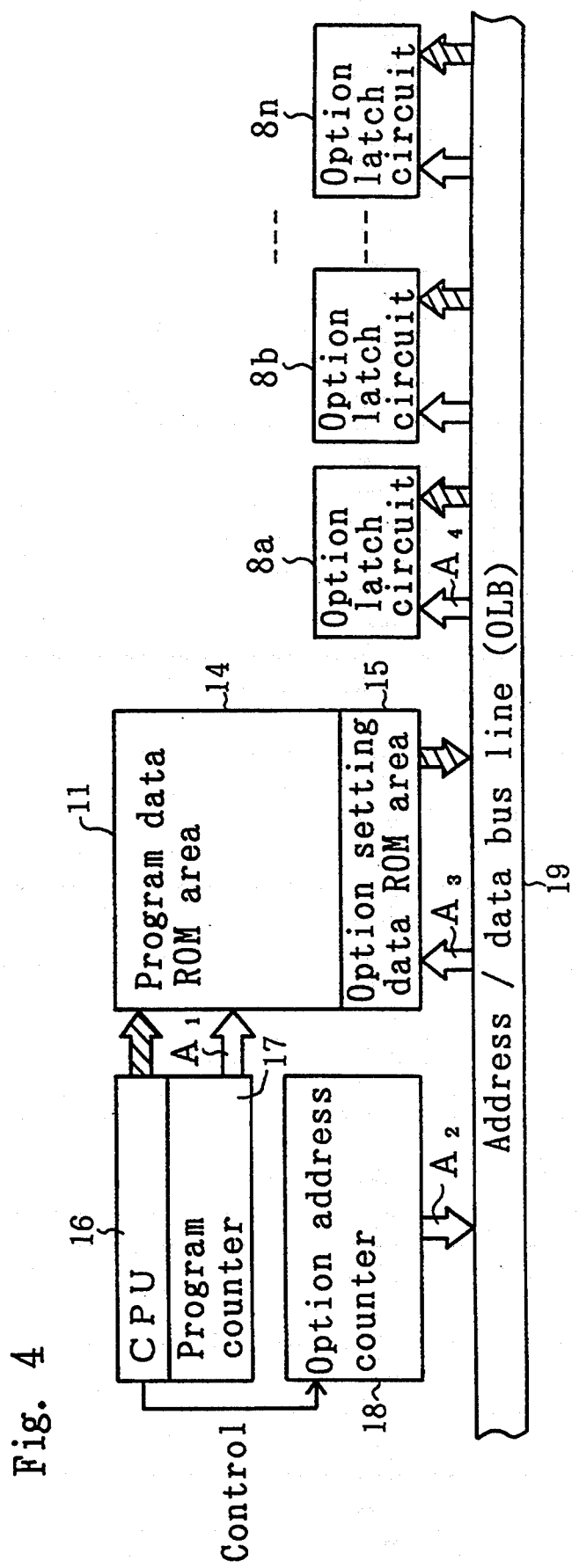
FIG. 4 shows an embodiment of the present invention.

Specifically, as shown in FIG. 4, an option address counter 18 producing an option address data in a predetermined cycle is provided separately from a program counter 17 provided in a CPU (central processing unit) 16 of the one-chip microcomputer which counter 17 is used for addressing for the case where data is written to the option data ROM 11. During the program running period, the address counter 18 is separated from under the control by the CPU 16 and the addressing of option latch circuits 8a, 8b, ... and 8n and the addressing of the option setting data ROM area 15 of the option data ROM 11 are performed independently of the CPU 16. In this case, the addressing of the program data ROM area 14 and that of the option setting data ROM area 15 during the program running period are separated from each other. White arrows show the flow of the address data, while hatched arrows show the flow of the option data.

During the program running period, the addressing of the program data ROM area 14 is performed based on address data transmitted through a line $A_1$. The addressing of the option setting data ROM area 15 is performed based on address data transmitted through a line $A_2$, a bus 19 and a line $A_3$. The addressing of the option latch circuits 8a, 8b, ... and 8n is performed based on address data transmitted through the line $A_2$, the bus 19 and a line $A_4$.

The option latch circuits 8a, 8b, ... and 8n are designed to be reset to its initial state by a power-on reset signal produced when the power is turned on and not to be reset by an external reset signal during the program running period. The power-on reset signal, which is produced, for example, by means of a time constant circuit including a resistor and a capacitor when a power to the one-chip microcomputer is switched ON, is active under low state for a predetermined period of time. Similarly to the resetting by the external reset signal, the one-chip microcomputer is reset to its initial state by the power-on reset signal, and then, the process proceeds to the execution of the program.

With this arrangement, during the program running period after the turning on of the power, the option address counter 18 operates independently of the CPU 16 to start addressing for option setting. That is, in this case, when an option address data specifying the option latch circuits are output in a predetermined cycle from the address counter 18 to an address/data bus line 19 used for both addressing and data, the option data ROM 11 outputs an option data located at an address specified by the option address data to the address/data bus line 19. Then, the option latch circuits 8a, 8b, ... and 8n receive the option data from the address/data bus line 19.

With this arrangement, every time the option address data specifying an option latch circuit are output from the address counter 18 during the program running period, the above-mentioned reading out of the option data from the option data ROM 11 and taking in of the data by the option latch circuits 8a, 8b, and 8n are performed, so that the same options are repeatedly set. Data writing to the option data ROM 11 is performed as follows. The address counter 18 is stopped by the CPU 16, and based on an address data from the program counter 17 provided in the CPU 16, both a program data and an option data are written to ROM areas therefor, respectively.

Figure 5:
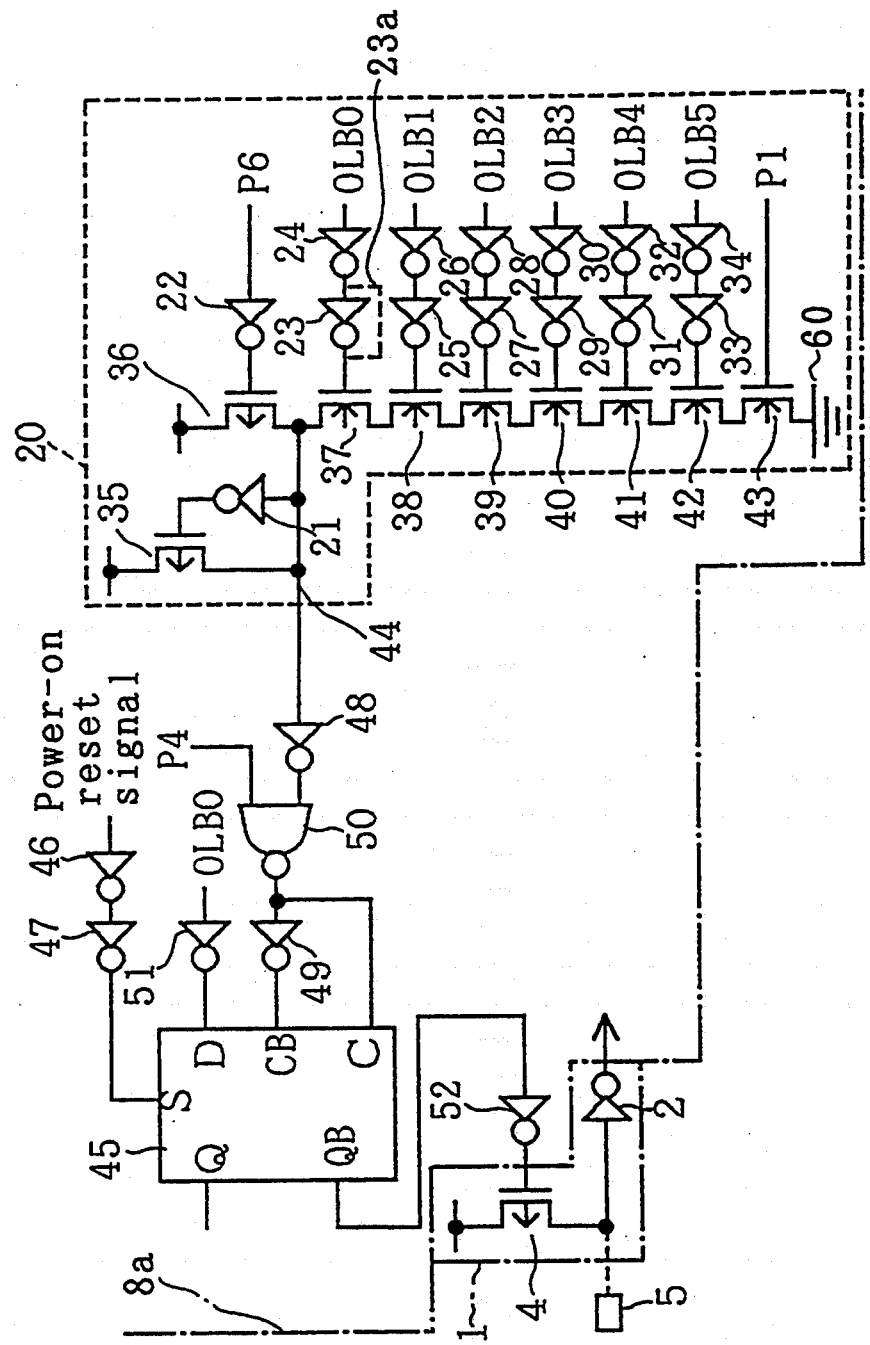
FIG. 5 is a view for explaining the addressing of an option setting circuit of the embodiment of FIG. 4.

Subsequently, the addressing of the option latch circuit 8a will specifically be described with reference to FIGS. 5 and 6.

Here, 20 is an address portion including inverters 21 to 34 and p-type and n-type MOS transistors 35 to 43. The address portion 20 takes in, in response to the fall of an internal timing signal P1, the option address data transmitted through six lines OLB0 to OLB5 out of eight lines OLB0 to OLB7 constituting the address/data bus line 19, and if the option address data being taken in coincides with an address provided to the address portion 20 of the option latch circuit 8a, the address portion 20 outputs a low-level address signal to an address line 44.

In this case, the address of the option latch circuit 8a is "111111", and the option latch circuit 8a is selected when the data on the address/data bus line 19 is changed to a "111111" option address data. If the input and output terminals of the inverter 23 are connected, for example, as shown by a dashed line 23a in FIG. 5, the option latch circuit 8a will be selected when a "0" signal is on the line OLB0, that is, when the option address data is "111110." Other option latch circuits (not shown) for other option latch circuits 8b, ... and 8n are provided with different addresses, respectively, so that they can be distinguished from each other.

Numeral 45 is a latch portion (D flip flop) being reset to its initial state by the power-on reset signal input to its set terminal through inverters 46 and 47. The gate of the latch portion 45 is opened to take in an option data input to a data terminal D through an inverter 51 while a low-level address signal is being input to its clock terminals C and CB through inverters 48 and 49 and a NAND circuit 50 in response to an internal timing signal P4.

In this case, the option data is transmitted through the line OLB0 of the address/data bus line 19 from the option data ROM 11. As the gate of the latch portion 45, for example, a CMOS is used. When the gate is activated (i.e. opened) when "0" and "1" signals are respectively input from the clock terminals C and CB to the gates of the p- and n-channel MOS transistors constituting the CMOS, the data input to the data terminal D is latched and output from an output terminal QB through an inverter 52 to the I/O circuit 1.

The internal timing signal P1, P4 and P6 are active under high state as shown at (e), (f) and (g) of FIG. 6. The periods thereof are decided by combination of six fixed periods T1 to T6. (a) of FIG. 6 shows a condition of the address/data bus line 19. The condition is switched in response to the internal timing signal P4 so that the option address data is transmitted during the periods T1 to T3 and the option data is transmitted during the periods T4 and T5. (b) of FIG. 6 shows the retention period of the address signal (low level) on the line 44 of FIG. 5. When the internal timing signal P6 is provided to the inverter 22, the transistor 36 is activated so that the line 44 is of high level. That is, the line 44 is pre-charged. At this time, the high level of the line 44 is inverted by the inverter 21 to activate the transistor 35. When the address data "111111" is provided through the lines OLB0 to OLB5 under a condition where the line 44 has been pre-charged, the transistors 37 to 42 are all activated. Moreover, during the periods T1 and T2, since the transistor 43 is activated, the line 44 is of low level. At this time, the transistor 35 is disabled. Since the internal timing signal P1 falls at the end of the period T2 and becomes of low level, the transistor 43 is disabled. As a result, the line 44 is separated from a ground line 60. However, the low level condition of the line 44 which has once become of low level is retained by a capacity such as the distributed capacity of the line 44. During the period T6, however, since the internal timing signal P6 is provided again, the line 44 is pre-charged and becomes of high level.

(c) of FIG. 6 shows a period (i.e. T4) during which the gate of the latch portion 45 is open, that is, a period during which the output of the NAND circuit is of low level. (d) of FIG. 6 shows a condition of the latch portion 45. An option address data OA(N) output from the address counter 18 after the power-on reset (reset applied at the time of the turning on of the power) is applied is "111111", the next option address data OA (N+1) is "000000", and the option address data next thereto is "000001". The option address data is counted up in this manner. The gate of the latch portion 45 is opened in response to the option address data OA(N), so that the state is changed from the initial state to an option data OD(N) set state. The set state is maintained until the option address data OA(N) is again output from the address counter 18.

With this arrangement, after the power-on reset has been applied, first, the internal timing signal P6 is input, and then, by the activation of the p-channel MOS transistor 36, the address line 44 is pre-charged to high level by an inverter 21 and the p-channel MOS transistor 35. Under this condition, by the input of the internal timing signal P1 in synchronism with the output of the option address data from the address counter 18, that is, during the periods T1 and T2, the address is decided. In this case, the option address data, which is "111111", coincides with the option address data provided to the option latch circuit 8a, so that the n-channel MOS transistors 37 to 43 are all activated to generate a low-level address signal. Consequently, during the period T4 when the internal timing signal P4 is input, the gate of the latch portion 45 is opened to take in an option data corresponding to the option address data "111111". The option is decided after the period T4.

According to the present invention, as described above, since the option setting is repeatedly performed during the operation period after the turning on of the power, even if the option setting becomes incorrect due to noise from external sources and electrostatic surge, the incorrect option setting is immediately returned to a correct state. Thus, misoperation is prevented. Moreover, since the above-mentioned latch circuit 45 is reset only when the power is turned on and since, even if an external reset signal is input during the operation period after the turning on of the power, the external reset signal is not input to the latch circuit 45 (consequently, the option setting is not changed), malfunction of an IC employing an option setting circuit caused by this change is prevented.

Obviously, many modifications and variations of the present invention are possible in light of the above teachings. It is therefore to be understood that within the scope of the appended claims, the invention may be practiced other than as specifically described.

What is claimed is:

1. An option setting circuit comprising:
   an option data memory which takes out an option data from an address and outputs the option data, said address being specified by an option address data;
   a latch circuit which latches the option data output from said option data memory based on the option address data, said latch circuit being reset when power is turned on;
   a circuit being set to a predetermined circuit state in accordance with an output of said latch circuit; and
   an option address circuit which causes the option address data to be repeatedly generated in a predetermined cycle during a program running period after a) the turning on of the power and b) a resetting period.

2. An option setting circuit for selectively setting a condition of a circuit outputting a first signal having a value of 1 and a second signal having a value of 0 in accordance with an input signal, said setting being performed so that under a condition where only one of the first signal having a value of 1 and the second signal having a value of 0 is input to said circuit, the other of the first and second signals is formed by said circuit, said option setting circuit comprising:
   a transistor connected between an input line of said circuit and a predetermined potential point;
   an option data memory which takes out an option data from an address an outputs the option data, said address being specified by an option address data;

a latch circuit which latches the option data output from said option data memory based on the option address data, said latch circuit being reset when power is turned on;

means for providing an output of said latch circuit to said transistor in order to set activation and disabling of the transistor; and an option address circuit which causes the option address data to be repeatedly generated in a predetermined cycle during a program running period after a) the turning on of the power and b) a resetting period.

3. An option setting circuit according to claim 2, wherein said latch circuit includes a flip flop having a set terminal, a data terminal, an address signal inputting terminal and an output terminal and wherein a power-on reset signal is provided to the set terminal.

4. An option setting circuit according to claim 1, wherein said option address circuit includes an address-/data bus line for option setting and an address counter for producing option address data.

5. An option setting circuit according to claim 2, wherein said option address circuit includes an address-/data bus line for option setting and an address counter for producing option address data.

* * * * *